United States Patent
Chang et al.

(10) Patent No.: US 12,396,256 B2
(45) Date of Patent: *Aug. 19, 2025

(54) SEMICONDUCTOR DEVICE INCLUDING TRANSISTORS SHARING GATES WITH STRUCTURES HAVING REDUCED PARASITIC CIRCUIT

(71) Applicant: TAIWAN SEMICONDUCTOR MANUFACTURING CO., LTD., Hsinchu (TW)

(72) Inventors: Yi-Feng Chang, New Taipei (TW); Po-Lin Peng, Taoyuan (TW); Jam-Wem Lee, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/413,869

(22) Filed: Jan. 16, 2024

(65) Prior Publication Data
US 2024/0153950 A1    May 9, 2024

Related U.S. Application Data

(60) Continuation of application No. 17/570,872, filed on Jan. 7, 2022, now Pat. No. 11,908,859, which is a
(Continued)

(51) Int. Cl.
*H10D 84/85* (2025.01)
*H10D 8/80* (2025.01)
*H10D 62/10* (2025.01)
*H10D 62/17* (2025.01)
*H10D 84/01* (2025.01)
*H10D 84/03* (2025.01)
*H10D 89/60* (2025.01)

(52) U.S. Cl.
CPC ............ *H10D 84/854* (2025.01); *H10D 8/80* (2025.01); *H10D 62/115* (2025.01); *H10D 62/371* (2025.01); *H10D 84/0186* (2025.01); *H10D 84/038* (2025.01); *H10D 89/713* (2025.01)

(58) Field of Classification Search
None
See application file for complete search history.

(56) References Cited

U.S. PATENT DOCUMENTS 5,686,752 A   11/1997   Ishimura et al.
6,229,185 B1   5/2001   Chen
(Continued)

*Primary Examiner* — Bilkis Jahan
(74) *Attorney, Agent, or Firm* — Maschoff Brennan

(57) ABSTRACT

A semiconductor device includes a first to sixth regions, a first gate, a first metal contact and a second metal contact. The second region is disposed opposite to the first region with respect to the first gate. The first metal contact couples the first region to the second region. The fourth region is disposed opposite to the third region with respect to the first gate. The second metal contact is coupling the third region to the fourth region. The fifth region is disposed between the first gate and the second region, and is disconnected from the first metal contact and the second metal contact. The sixth region is disposed between the first gate and the first region, and is disconnected from the first metal contact and the second metal contact.

20 Claims, 5 Drawing Sheets

Related U.S. Application Data continuation of application No. 16/525,275, filed on Jul. 29, 2019, now Pat. No. 11,222,893, which is a division of application No. 15/691,725, filed on Aug. 30, 2017, now Pat. No. 10,366,992.

(56) References Cited

U.S. PATENT DOCUMENTS

| | | |
|---|---|---|
| 6,559,508 B1 | 5/2003 | Lin et al. |
| 8,737,027 B1 | 5/2014 | Walker |
| 8,823,129 B2 | 9/2014 | Lai et al. |
| 8,829,570 B2 | 9/2014 | Parthasarathy et al. |
| 9,006,781 B2 | 4/2015 | Salcedo et al. |
| 9,048,101 B2 | 6/2015 | Liang et al. |
| 9,099,523 B2 | 8/2015 | Salman et al. |
| 9,520,389 B1 | 12/2016 | Chang et al. |
| 9,831,233 B2 | 11/2017 | Salcedo et al. |
| 11,908,859 B2 * | 2/2024 | Chang ................ H10D 89/713 |
| 2003/0007301 A1 | 1/2003 | Ker et al. |
| 2003/0058027 A1 * | 3/2003 | Kwon ................ H10D 89/813 327/401 |
| 2006/0033163 A1 * | 2/2006 | Chen ................ H01L 23/62 257/361 |
| 2007/0122963 A1 * | 5/2007 | Chen ................ H10D 84/038 257/273 |
| 2008/0258771 A1 * | 10/2008 | Tachibana ......... H03K 19/0013 326/98 |
| 2009/0174470 A1 | 7/2009 | Tseng |
| 2010/0314709 A1 * | 12/2010 | Lai ................ H10D 84/854 257/500 |
| 2012/0205714 A1 * | 8/2012 | Salcedo ............ H10D 84/0112 257/140 |
| 2012/0257317 A1 * | 10/2012 | Abou-Khalil .... H03K 19/00361 716/101 |
| 2014/0167105 A1 | 6/2014 | Salcedo et al. |
| 2015/0008476 A1 | 1/2015 | Shrivastava et al. |
| 2015/0364471 A1 | 12/2015 | Chang et al. |
| 2016/0079750 A1 * | 3/2016 | Edwards ............. H10D 89/713 257/146 |
| 2016/0261110 A1 * | 9/2016 | Ivanov ................ H10D 89/713 |
| 2016/0300830 A1 * | 10/2016 | Salcedo ............. H10D 89/10 |
| 2016/0358904 A1 * | 12/2016 | Lin ................ H10D 62/126 |
| 2017/0069618 A1 * | 3/2017 | Altolaguirre ........ H10D 84/403 |

* cited by examiner

SEMICONDUCTOR DEVICE INCLUDING TRANSISTORS SHARING GATES WITH STRUCTURES HAVING REDUCED PARASITIC CIRCUIT

RELATED APPLICATION

This application is a continuation Application of U.S. application Ser. No. 17/570,872, filed Jan. 7, 2022, which is a continuation Application of U.S. application Ser. No. 16/525,275, filed Jul. 29, 2019, now U.S. Pat. No. 11,222,893, issued Jan. 11, 2022, which is a divisional application of the U.S. application Ser. No. 15/691,725, filed Aug. 30, 2017, now U.S. Pat. No. 10,366,992, issued Jul. 30, 2019, all of which are herein incorporated by reference.

BACKGROUND

Latchup is a phenomenon of parasitic SCR paths triggered by internal or external noise in a CMOS circuit, which causes malfunction or electrical failure. Meanwhile, single event latchup caused by particle striking or electromagnetic radiation prevents the CMOS circuit from applications of aerospace, outer space, server and automobile, etc.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
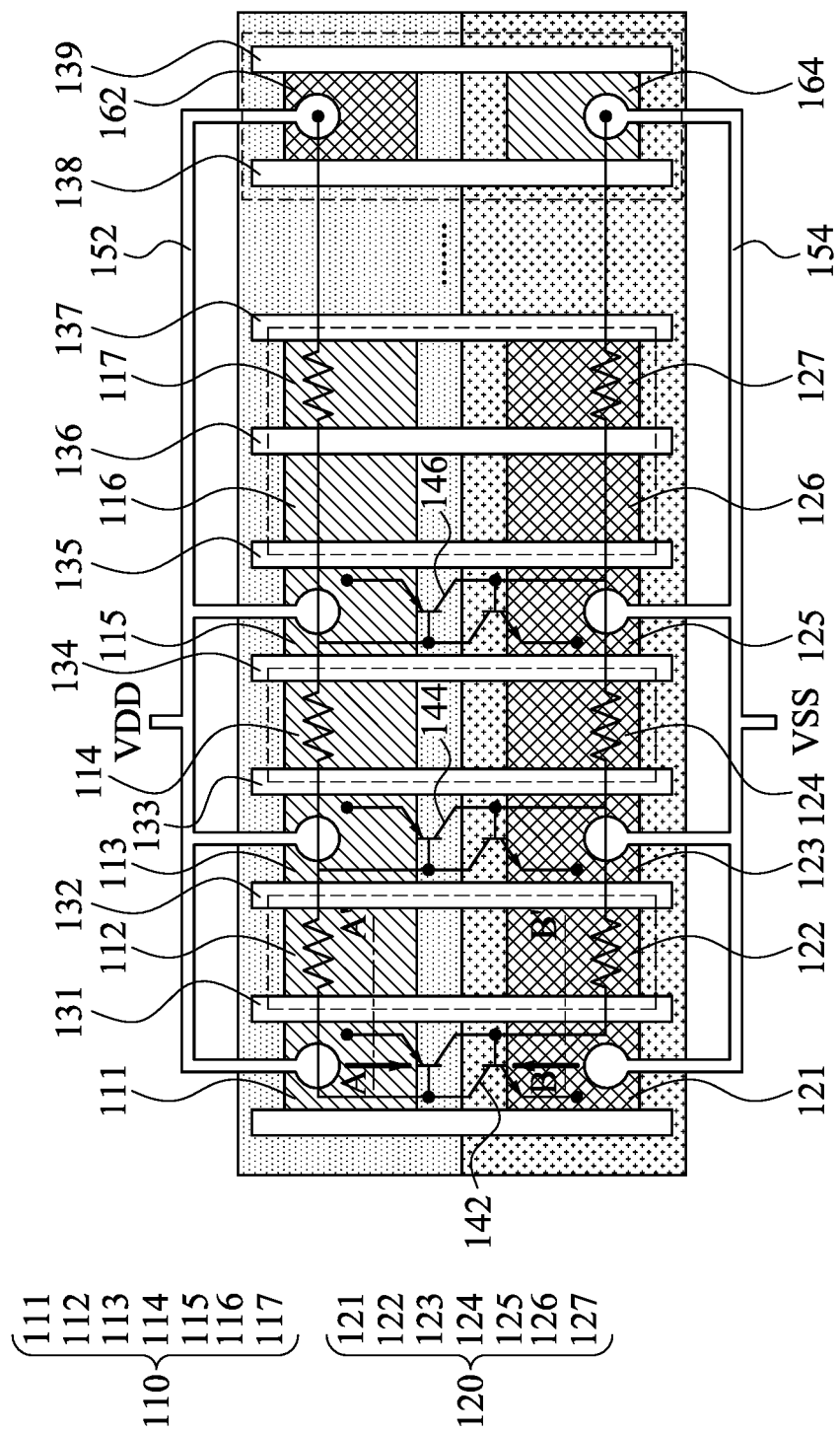
FIG. 1 is a diagram of a semiconductor device, in accordance with various embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Reference is now made to FIG. 1. FIG. 1 is a diagram of a semiconductor device 100, in accordance with various embodiments. As illustrated in FIG. 1, the semiconductor device 100 includes a first active area 110 of a first type, a second active area 120 of a second type, and a plurality of gates 131~139. The gates 131~139 are arranged above and across the first active area 110 and the second active area 120. In various embodiments, the first type is a P-type and the second type is an N-type. However, the scope of the disclosure is not intended to be limited in the above-mentioned types, and other suitable arrangement of types of the first type and the second type are within the contemplated scope of the present disclosure.

As illustrated in FIG. 1, a first region 111 of the first active area 110 and a first region 121 of the second active area 120 are disposed at a first side of a first gate 131 of the plurality of gates 131~139. A second region 112 of the first active area 110 and a second region 122 of the second active area 120 are disposed at a second side of the first gate 131. Explain in a different way, the first region 111 of the first active area 110 and the first region 121 of the second active area 120 are disposed at the left side of the first gate 131 of the plurality of gates 131~139. The second region 112 of the first active area 110 and the second region 122 of the second active area 120 are disposed at the right side of the first gate 131.

In various embodiments, the first region 111 and the third region 113 of the first active area 110 are coupled to a metal contact 152, and the first region 121 and the third region 123 of the second active area 120 are coupled to a metal contact 154.

In some embodiments, there are fourth region 114, fifth region 115, sixth region 116, and seventh region 117 of the first active area 110 and fourth region 124, fifth region 125, sixth region 126, and seventh region 127 of the second active area 120 in FIG. 1. The pattern is that the first regions 111, 121, the third regions 113, 123, and the fifth regions 115, 125 are coupled to the metal contact 152 or the metal contact 154, and the second regions 112, 122, the fourth regions 114, 124 are not coupled to the metal contact 152 or the metal contact 154. However, the scope of the disclosure is not intended to be limited in the above-mentioned configuration. As illustrated in FIG. 1, there are sixth regions 116, 126 and seventh regions 117, 127 that are not coupled to the metal contact 152 or the metal contact 154, and other suitable configuration are within the contemplated scope of the present disclosure. In various embodiments, the regions that are not coupled to the metal contact 152 or the metal contact 154 are configured as fillers.

In some embodiments, a region 162 and a region 164 are configured as body. The region 162 is coupled to the metal contact 152, and the region 164 is coupled to the metal contact 154. In various embodiments, the region 162 is the second type, and the region 164 is the first type.

Figure 2:
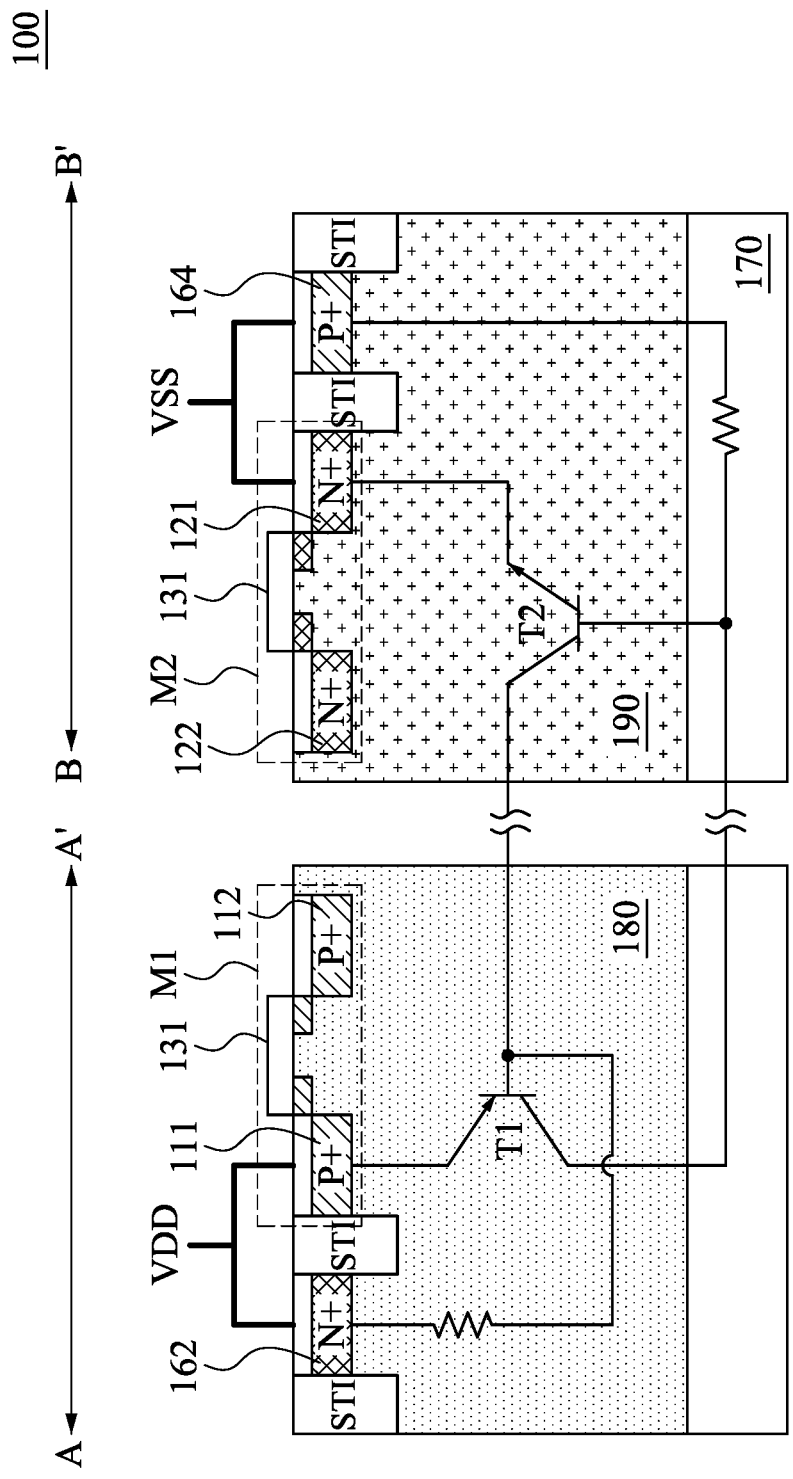
FIG. 2 is a cross-sectional view of the semiconductor device in FIG. 1, in accordance with various embodiments.

Reference is now made to FIG. 2. FIG. 2 is a cross-sectional view of the semiconductor device in FIG. 1, in accordance with various embodiments. It is noted that the cross-sectional view of the semiconductor device 100 in FIG. 2 is for explanation purpose for understanding the SCR circuits 142, 144, 146 in the semiconductor device 100, and it is not illustrated by actual cross-sectional structure of FIG. 1, which is described in detailed as below.

As illustrated in the left side of FIG. 2, it is a cross-sectional view of the semiconductor device 100 across line AA' in FIG. 1. It is noted that the direction of the line AA' in FIG. 1 is from the left side to the right side. The semiconductor device 100 further includes a substrate 170, and a first well 180 of the second type. The first well 180 of the second type is formed on the substrate 170. The first region 111 and the second region 112 of the first active area 110 are formed in the first well 180. The gate 131 is formed on the first well 180. The first region 111 of the first active area 110 is configured as a source region of a transistor M1, and the second region 112 of the first active area 110 is configured as a drain region of the transistor M1.

Reference is now made to the right side of FIG. 2. It is a cross-sectional view of the semiconductor device 100 across line BB' in FIG. 1. It is noted that the direction of the line BB' in FIG. 1 is from the right side to the left side, which is opposite to the direction of the line AA'. The semiconductor device 100 further includes a second well 190 of the first type. The second well 190 of the first type is formed on the substrate 170. The first region 121 and the second region 122 of the second active area 120 are formed in the second well 190. The gate 131 is formed on the second well 190. The first region 121 of the second active area 120 is configured as a source region of a transistor M2, and the second region 122 of the second active area 120 is configured as a drain region of the transistor M2.

In various embodiments, the first region 111 of the first active area 110, the first well 180, the second well 190, and the first region 121 of the second active area 120 are configured to operate as the equivalent SCR circuit 142. In some embodiments, the equivalent SCR circuit 142 is formed by a transistor T1 and a transistor T2. The emitter of the transistor T1 is coupled to the first region 111 of the first active area 110, the base of the transistor T1 is coupled to the body region 162 and the collector of the transistor T2, and the collector of the transistor T1 is coupled to the base of the transistor T2. The emitter of the transistor T2 is coupled to the first region 121 of the second active region 120, and the base of the transistor T2 is coupled to the body region 164.

Figure 3:
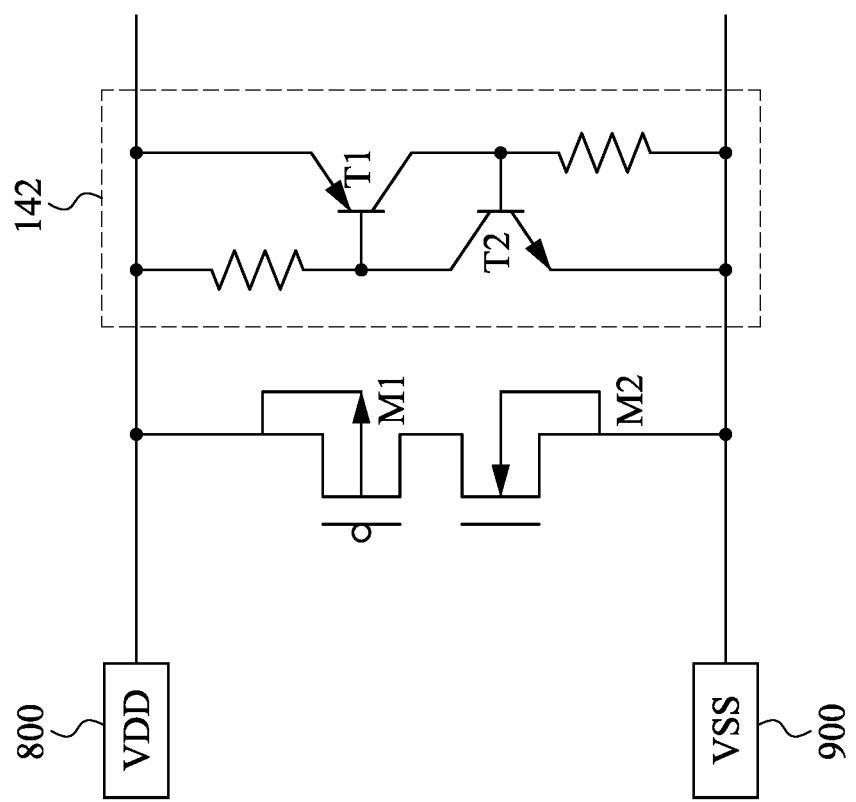
FIG. 3 is an equivalent circuit of the semiconductor device in FIG. 1, in accordance with various embodiments.

For further understanding the original circuit and the parasitic circuit in the semiconductor device 100, reference is now made to FIG. 3. FIG. 3 is an equivalent circuit of the semiconductor device 100 in FIG. 1, in accordance with various embodiments. As shown in FIG. 3, there are complementary metal oxide semiconductors (CMOS) and the equivalent SCR circuit 142. The CMOS is composed of a metal oxide semiconductor field effect transistor (MOSFET) M1 and a MOSFET M2. Reference is now made to both FIG. 2 and FIG. 3, the first region 111 of the first active area 110 is configured as a source region of the MOSFET M1, and the second region 112 of the first active area 110 is configured as a drain region of the MOSFET M1. In addition, the first region 121 of the second active area 120 is configured as a source region of the MOSFET M1, and the second region 122 of the second active area 120 is configured as a drain region of the MOSFET M2. The first region 111 of the first active area 110, the first well 180, the second well 190, and the first region 121 of the second active area 120 in FIG. 2 are configured to operate as the equivalent SCR circuit 142 in FIG. 3.

As illustrated in FIG. 3, if noises occur in the semiconductor device 100 and the base of the transistor T1 is pulled low, the transistor T1 is turned on and a power source 800 provides the first voltage VDD through the transistor T1 to the base of the transistor T2. Subsequently, the transistor T2 is turned on due to the first voltage VDD, and a short path is therefore formed in the semiconductor device 100, such that a high current leakage from the power source 800 to the ground 900 occurs. However, the configuration of the semiconductor device 100 in FIG. 1 may improve the above-mentioned phenomenon. The following description explains how to improve the above-mentioned phenomenon together with a flow chart of a method 400.

Figure 4:
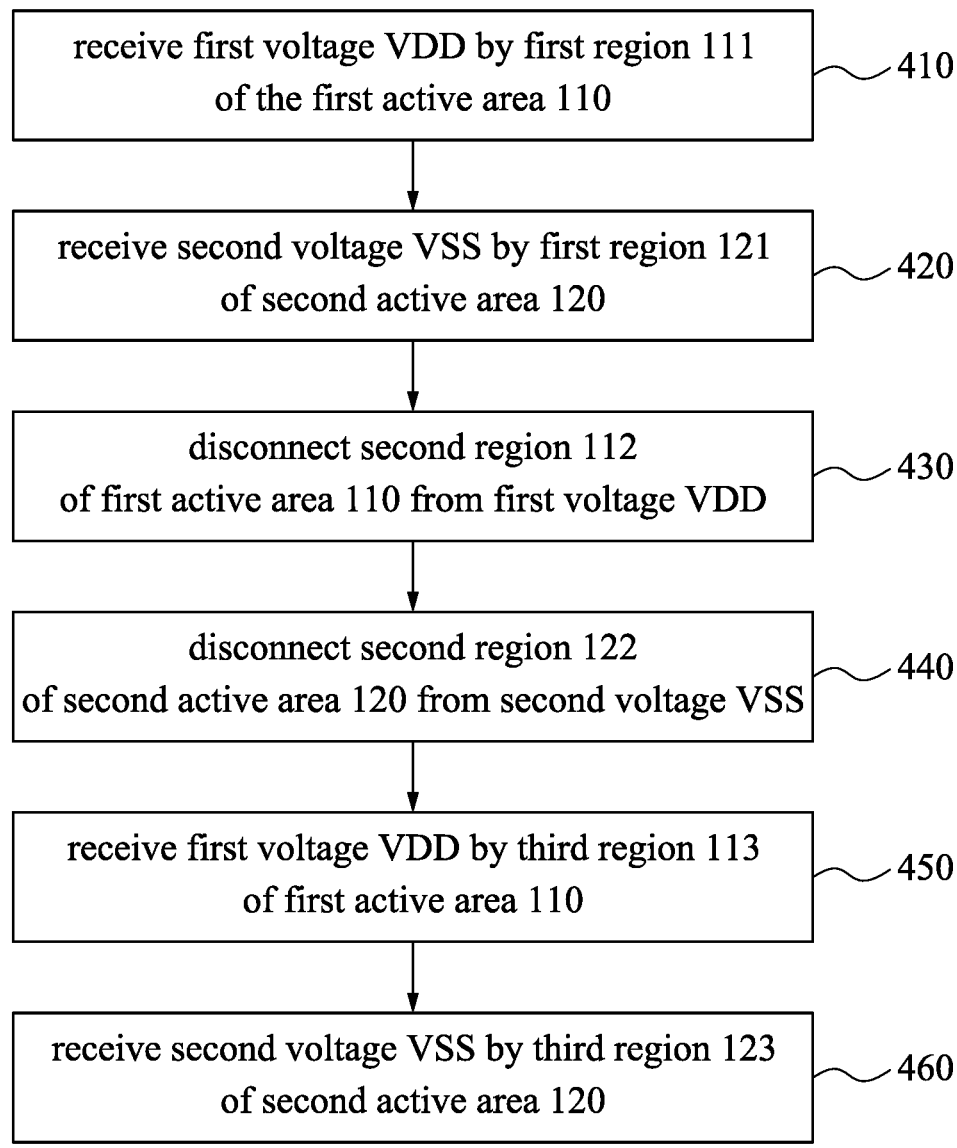
FIG. 4 is a flow chart of a method for fabricating the semiconductor device in FIG. 1, in accordance with various embodiments.

Reference is now made to FIG. 4. FIG. 4 is a flow chart of a method 400 for fabricating the semiconductor device 100 in FIG. 1, in accordance with various embodiments. For illustration, the fabricating process of the semiconductor device 100 in FIG. 1 is described by the method 400.

With reference to the method 400 in FIG. 4 in operation 410, the first region 111 of the first active area 110 is configured to receive a first voltage VDD. In some embodiments, referring to FIG. 1, FIG. 2 and FIG. 3, the metal contact 152 is coupled to the power source as shown in FIG. 3, and therefore, the first region 111 of the first active area 110 is configured to receive the first voltage VDD provided by the power source 800 through the metal contact 152.

In operation 420, the first region 121 of the second active area 120 is configured to receive a second voltage VSS. In some embodiments, referring to FIG. 1, FIG. 2 and FIG. 3, the metal contact 154 is coupled to ground 900, and therefore, the first region 121 of the second active area 120 is configured to receive the second voltage VSS introduced by the ground 800 through the metal contact 154. In various embodiments, the first voltage VDD is a power supply voltage or a high level voltage, and the second voltage VSS is ground voltage or a low level voltage. However, the scope of the disclosure is not intended to be limited in such kinds of the voltages, and other suitable kinds of the voltages are within the contemplated scope of the present disclosure.

In operation 430, the second region 112 of the first active area 110 is disconnected from the first voltage VDD. In some embodiments, referring to FIG. 1, FIG. 2, and FIG. 3, the second region 112 of the first active area 110 is not coupled to the metal contact 152, and therefore, the second region 112 of the first active area 110 is disconnected from the first voltage VDD provided by the power source 800.

In operation 440, the second region 122 of the second active area 120 is disconnected from the second voltage VSS. In some embodiments, referring to FIG. 1, FIG. 2, and FIG. 3, the second region 122 of the second active area 120 is not coupled to the metal contact 154, and therefore, the second region 122 of the second active area 120 is disconnected from the second voltage VSS introduced by the ground 900.

As illustrated in FIG. 1, a second gate 132 of the plurality of gates 131~139 is disposed adjacent to the first gate 131, the second region 112 of the first active area 110 and the second region 122 of the second active area 120 are arranged at a first side of the second gate 132, and a third region 113 of the first active area 110 and a third region 123 of the second active area 120 are arranged at a second side of the second gate 132. Explain in a different way, the second region 112 of the first active area 110 and the second region 122 of the second active area 120 are arranged at the left side of the second gate 132, and the third region 113 of the first active area 110 and the third region 123 of the second active area 120 are arranged at the right side of the second gate 132.

In some embodiments, the third region 113 of the first active area 110 is coupled to the metal contact 152, and the third region 123 of the second active area 120 is coupled to the metal contact 154.

With reference to the method 400 in FIG. 4, in operation 450, the third region 113 of the first active area 110 is configured to receive the first voltage VDD. In some embodiments, referring to FIG. 1, FIG. 2 and FIG. 3, the third region 113 of the first active area 110 is configured to receive the first voltage VDD provided by the power source 800 through the metal contact 152.

In operation 460, the third region 123 of the second active area 120 is configured to receive the second voltage VSS. In some embodiments, referring to FIG. 1, FIG. 2 and FIG. 3, the third region 123 of the second active area 120 is configured to receive the second voltage VSS introduced by the ground 900 through the metal contact 154.

The above description of the method 400 includes exemplary operations, but the operations of the method 400 are not necessarily performed in the order described. The order of the operations of the method 400 disclosed in the present disclosure are able to be changed, or the operations are able to be executed simultaneously or partially simultaneously as appropriate, in accordance with the spirit and scope of some embodiments of the present disclosure. In addition, the operations may be added, replaced, changed order, and/or eliminated as appropriate, in accordance with the spirit and scope of some embodiments of the present disclosure.

In some embodiments, referring to FIG. 1, the second region 112 of the first active area 110 and the second region 122 of the second active area 120 are floating. In various embodiments, the fourth region 114 of the first active area 110 and the fourth region 124 of the second active area 120 are floating. In some embodiments, referring to FIG. 1, the sixth regions 116, 126 and the seventh regions 117, 127 of the first active area 110 and the second active area 120 are floating.

As illustrated in FIG. 1, equivalent silicon controlled rectifier (SCR) circuits 142, 144, and 146 are parasitic SCRs occurred in the regions that receive the first voltage VDD and the second voltage VSS. Due to the configuration in FIG. 1, a portion of the regions receive the first voltage VDD and the second voltage VSS, and therefore, the number of the SCR circuits is reduced, and a high current leakage phenomenon generated by the SCR circuits is improved as well.

Figure 5:
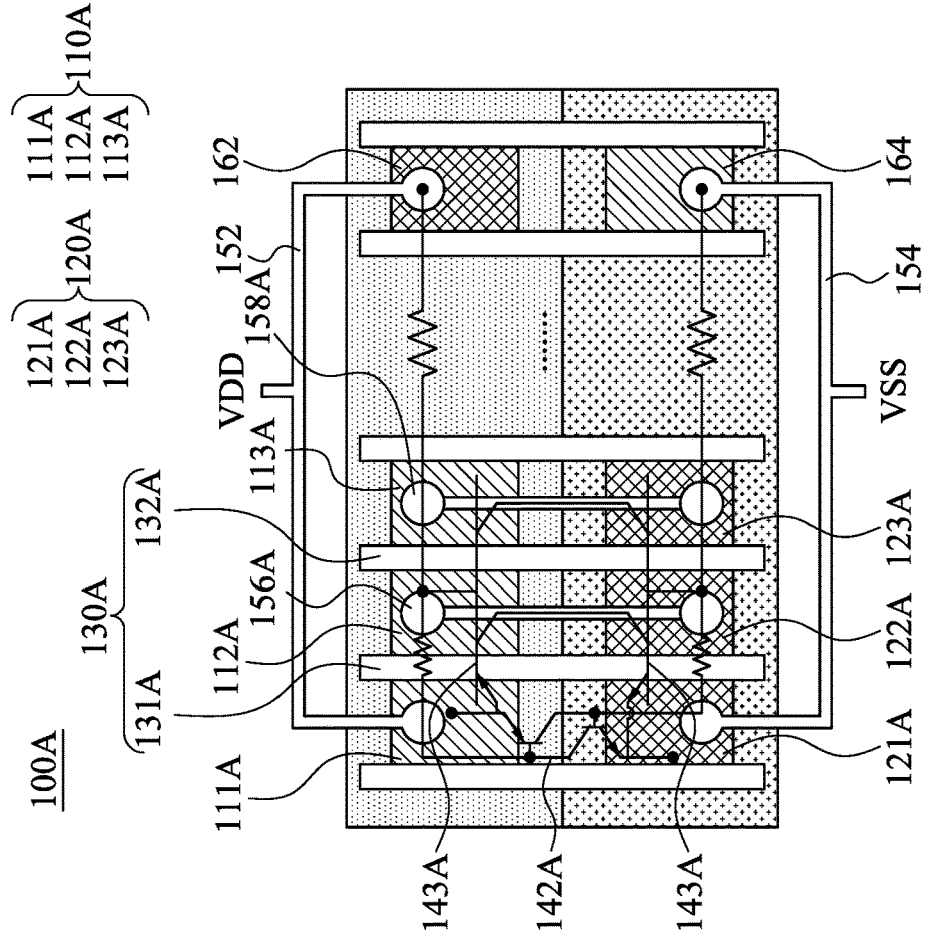
FIG. 5 is a diagram of a semiconductor device, in accordance with various embodiments.

Reference is now made to FIG. 5. FIG. 5 is a diagram of a semiconductor device 100A, in accordance with various embodiments. Compared with the semiconductor device 100 in FIG. 1, a portion of the connections of the semiconductor device 100A in FIG. 5 is different, which is described in detailed as below. As illustrated in FIG. 5, the first region 111A of the first active area 110 is still configured to receive the first voltage VDD, the first region 121A of the second active area 120A is still configured to receive the second voltage VSS, the second region 112A of the first active area 110A is still disconnected from the first voltage VDD, and the second region 122A of the second active area 120A is still disconnected from the second voltage VSS. It is noted that the second region 112A of the first active area 110A and the second region 122A of the second active area 120A are coupled to each other. In various embodiments, the second region 112A of the first active area 110A and the second region 122A of the second active area 120A are coupled to each other by a metal contact 156A.

In various embodiments, when there are noises occurred in the semiconductor device 100A in FIG. 5, the equivalent SCR circuit 142A is triggered. Meanwhile, a first type current introduced by the first voltage VDD and a second type current introduced by the second voltage VSS tend to flow through the metal contact 156A between the second region 112A of the first active area 110A and the second region 122A of the second active area 120A because the resistance of the metal contact 156A is lower than the resistance of the equivalent SCR circuit 142A. In view of the above, less current flows through the equivalent SCR circuit 142A, and the high current leakage phenomenon happened in the equivalent SCR circuit 142A is therefore improved.

In some embodiments, as illustrated in FIG. 5, the third region 113A of the first active area 110A is disconnected from the first voltage VDD, and the third region 123A of the second active area 120A is disconnected from the second voltage VSS. Due to the configuration in FIG. 5, part of the regions receive the first voltage VDD and the second voltage VSS, and therefore, the number of the SCR circuits is reduced, and the high current leakage phenomenon generated by the SCR circuits is further improved.

In various embodiments, the third region 113A of the first active area 110A and the third region 123A of the second active area 120A are coupled to each other. In some embodiments, the third region 113A of the first active area 110A and the third region 123A of the second active area 120A are coupled to each other by a metal contact 158A. Due to such configuration, the first type current introduced by the first voltage VDD and the second type current introduced by the second voltage VSS tend to flow through the metal contact 156A between the second region 112A and the second region 122A, and flows through the metal contact 158A between the third region 113A and the third region 123A because the resistance of the metal contact 158A is lower than the resistance of the equivalent SCR circuit 142A. Therefore, less and less current flows through the equivalent SCR circuit 142A, and the high current leakage phenomenon happened in the equivalent SCR circuit 142A is even more improved.

Furthermore, different types of the currents introduced by the first voltage VDD and the second voltage VSS are neutralized, which is explained in detailed in the following description regarding FIG. 6.

Figure 6:
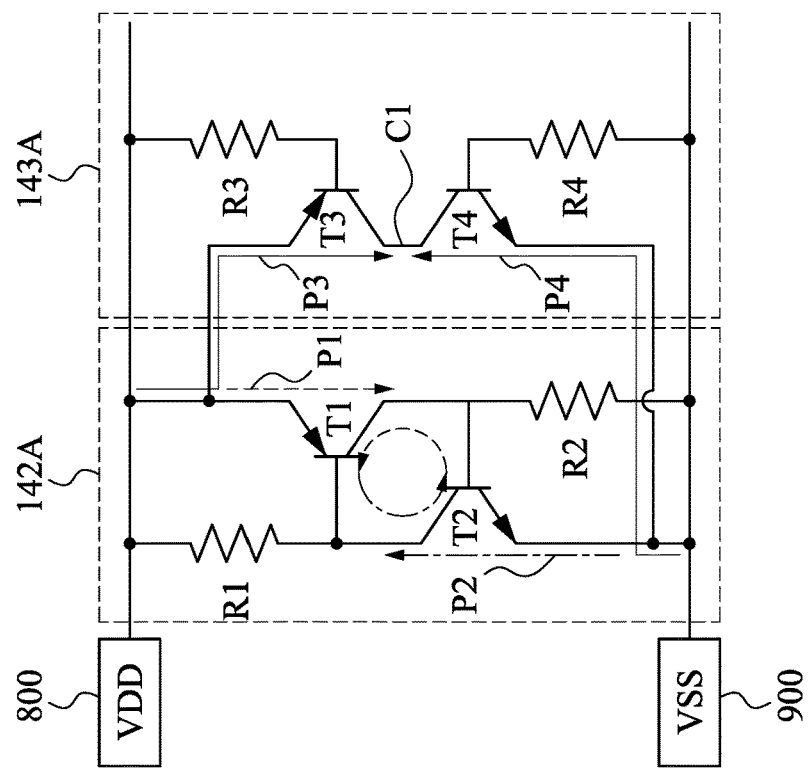
FIG. 6 is an equivalent circuit of the semiconductor device in FIG. 5, in accordance with various embodiments.

Reference is now made to FIG. 6. FIG. 6 is an equivalent circuit of the semiconductor device 100A in FIG. 5, in accordance with various embodiments. For facilitating the understanding of FIG. 6, reference is now made to FIG. 2, FIG. 5 and FIG. 6. The first region 111A of the first active area 110A, the first well 180, the second well 190, and the first region 121A of the second active area 120A are configured to operate as the equivalent SCR circuit 142A. The first region 111A of the first active area 110A and the first region 112A of the first active area 110A are regard as the parasitic transistor T3 of the parasitic circuit 143A, and the first region 121A of the second active area 120A and the second region 122A of the second active area 120A are regard as the parasitic transistor T4 of the parasitic circuit 143A.

As can be seen in FIG. 5 and FIG. 6, when there are noises occurred in the semiconductor device 100A and the equivalent SCR circuit 142A is triggered, the first type current introduced by the first voltage VDD originally flows through the path P1 and the second type current introduced by the second voltage VSS originally flows through the path P2, such that a short path of the equivalent SCR circuit 142A is formed and the high leakage current flows from the power source 800 to the ground 900. However, owing to the connection of the parasitic transistors T3, T4 established by the metal contact 156A, most of the first type current introduced by the first voltage VDD tends to flow through the path P3, and most of the second type current introduced by the second voltage VSS tends to flow through the path P4 when the equivalent SCR circuit 142A is triggered by noises.

In some embodiments, the first type current is composed of holes, and the second type current is composed of electrons. When the holes flow through the path P3 and the electrons flow through the path P4, the holes and the electrons neutralized at the connection of the parasitic transistors T3, T4 established by the metal contact 156A. In view of the above, the original high leakage current generated by the equivalent SCR circuit 142A not only tends to flow through the parasitic transistors T3~T4, but the neutralization occurs to reduce the high leakage current. Therefore, the high current leakage phenomenon happened in the equivalent SCR circuit 142A is even more improved.

In some embodiments, a semiconductor device is disclosed that includes a first region, a first gate, a second region, a first metal contact, a third region, a fourth region, a second metal contact, a fifth region and a sixth region. The second region is disposed opposite to the first region with respect to the first gate. The first metal contact couples the first region to the second region. The fourth region is disposed opposite to the third region with respect to the first gate. The second metal contact couples the third region to the fourth region. The fifth region is disposed between the first gate and the second region, and is disconnected from the first metal contact and the second metal contact. The sixth region is disposed between the first gate and the first region, and disconnected from the first metal contact and the second metal contact.

Also disclosed is a semiconductor device that includes a first metal contact, a second metal contact, a first gate, a second gate and a third metal contact. The first metal contact is configured to have a first voltage level. The second metal contact is configured to have a second voltage level. The first gate is disposed between two terminals of the first metal contact, and is disposed between two terminals of the second metal contact. The second gate is disposed between the first gate and a first terminal of the two terminals of the first metal contact, and is disposed between the first gate and a first terminal of the two terminals of the second metal contact. The third metal contact is disposed between the first gate and the second gate, and is disconnected from the first metal contact and the second metal contact.

Also disclosed is a semiconductor device that includes a first transistor to a fourth transistor. A first terminal of the first transistor is configured to receive a first voltage signal. A first terminal of the second transistor is configured to receive a second voltage signal, a second terminal of the second transistor is coupled to a control terminal of the first transistor, and a control terminal of the second transistor is coupled to a second terminal of the first transistor. A first terminal of the third transistor is configured to receive the first voltage signal. A first terminal of the fourth transistor is configured to receive the second voltage signal, a second terminal of the fourth transistor is coupled to a second terminal of the third transistor, and a control terminal of the fourth transistor is configured to receive the second voltage signal through a first resistor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
    a first region, a second region, a third region and a fourth region separated from each other;
    a first metal contact coupling the first region to the second region;
    a second metal contact coupling the third region to the fourth region, and isolated from the first metal contact; and
    a first gate disposed between the first region and the second region, and disposed between the third region and the fourth region.

2. The device of claim 1, further comprising:
    a second gate disposed between the first region and the first gate, and disposed between the third region and the first gate.

3. The device of claim 1, further comprising:
    a fifth region disposed between the second region and the first gate, and isolated from the first metal contact,
    wherein the first region and the fifth region are included in a first active area.

4. The device of claim 3, further comprising:
    a third metal contact coupled to the fifth region,
    wherein a part of the third metal contact is interposed between the third region and the fourth region.

5. The device of claim 4, further comprising:
    a sixth region disposed between the fourth region and the first gate, and electrically isolated from the second metal contact,
    wherein the third region and the sixth region are included in a second active area.

6. The device of claim 1, further comprising:
    a third metal contact and a fourth metal contact separated from each other along a direction,
    wherein the first gate is interposed between the third metal contact and the fourth metal contact along the direction.

7. The device of claim 6, wherein the first metal contact, the second metal contact, the third metal contact and the fourth metal contact are isolated from each other.

8. The device of claim 6, further comprising:
    a second gate disposed between the first region and the second region, and disposed between the third region and the fourth region,
    wherein the third metal contact is interposed between the first gate and the second gate.

9. A device, comprising:
    a first metal contact;
    a second metal contact separated from the first metal contact;
    a first gate disposed between a first terminal of the first metal contact and a second terminal of the first metal contact, and disposed between a first terminal of the second metal contact and a second terminal of the second metal contact; and
    a third metal contact disposed between the first gate and the first terminal of the first metal contact, disposed between the first gate and the first terminal of the second metal contact, and disconnected from each of the first metal contact and the second metal contact.

10. The device of claim 9, further comprising:
a fourth metal contact disposed between the third metal contact and the first terminal of the first metal contact, disposed between the third metal contact and the first terminal of the second metal contact, and disconnected from each of the first metal contact, the second metal contact and the third metal contact.

11. The device of claim 10, further comprising:
a second gate interposed between the third metal contact and the fourth metal contact.

12. The device of claim 10, further comprising:
a first active area coupled to each of the first metal contact, the third metal contact and the fourth metal contact; and
a second active area coupled to each of the second metal contact, the third metal contact and the fourth metal contact.

13. The device of claim 12, wherein the first gate crosses over each of the first active area and the second active area.

14. The device of claim 12, wherein a conductive type of the first active area is different from a conductive type of the second active area.

15. A device, comprising:
a first transistor, wherein a first terminal of the first transistor is configured to receive a first voltage signal, and a second terminal of the first transistor is configured to receive a second voltage signal through a first resistor;
a second transistor, wherein a first terminal of the second transistor is configured to receive the first voltage signal and a control terminal of the second transistor is configured to receive the first voltage signal through a second resistor; and
a third transistor, wherein a first terminal of the third transistor is configured to receive the second voltage signal, a second terminal of the third transistor is coupled to a second terminal of the second transistor, and a control terminal of the third transistor is configured to receive the second voltage signal through a third resistor.

16. The device of claim 15, further comprising:
a fourth transistor coupled between a control terminal of the first transistor and the first terminal of the third transistor.

17. The device of claim 16, wherein a control terminal of the fourth transistor is coupled to the second terminal of the first transistor.

18. The device of claim 16, wherein a first terminal of the fourth transistor is configured to receive the first voltage signal through a fourth resistor.

19. The device of claim 18, wherein a second terminal of the fourth transistor is configured to receive the second voltage signal.

20. The device of claim 18, wherein the control terminal of the first transistor is configured to receive the first voltage signal through the fourth resistor.

* * * * *